United States Patent
Gao et al.

(10) Patent No.: US 9,338,446 B2
(45) Date of Patent: May 10, 2016

(54) METHOD OF STARTING CAMERA IN USER EQUIPMENT, USER EQUIPMENT AND STORAGE MEDIUM

(71) Applicant: HISENSE MOBILE COMMUNICATIONS TECHNOLOGY CO., LTD., Qingdao (CN)

(72) Inventors: Chao Gao, Qingdao (CN); Xudong Qiu, Qingdao (CN); Sanfeng Yan, Qingdao (CN); Changsheng Zhou, Qingdao (CN); Peng Jiang, Qingdao (CN)

(73) Assignees: HISENSE MOBILE COMMUNICATIONS TECHNOLOGY CO., LTD., Qingdao (CN); HISENSE USA CORPORATION, Suwanee, GA (US)

( * ) Notice: Subject to any disclaimer, the term of this patent is extended or adjusted under 35 U.S.C. 154(b) by 112 days.

(21) Appl. No.: 14/256,583

(22) Filed: Apr. 18, 2014

(65) Prior Publication Data

US 2015/0237342 A1 Aug. 20, 2015

(30) Foreign Application Priority Data

Feb. 18, 2014 (CN) .......................... 2014 1 0055912

(51) Int. Cl.
*H04N 17/00* (2006.01)
*G11C 17/00* (2006.01)
*H04N 5/232* (2006.01)

(52) U.S. Cl.
CPC .............. *H04N 17/002* (2013.01); *G11C 17/00* (2013.01); *H04N 5/23225* (2013.01); *H04N 5/23229* (2013.01)

(58) Field of Classification Search
None
See application file for complete search history.

(56) References Cited

U.S. PATENT DOCUMENTS

| 5,692,224 A * | 11/1997 | Saegusa ................. G03B 7/091 396/207 |
| 2011/0149112 A1* | 6/2011 | Muukki ............... H04N 5/3572 348/231.6 |
| 2012/0218458 A1* | 8/2012 | Pavithran ............. H04N 5/2256 348/345 |
| 2013/0222608 A1* | 8/2013 | Baer .................... H04N 17/002 348/189 |

* cited by examiner

*Primary Examiner* — Michael Teitelbaum

(57) ABSTRACT

A method of starting a camera, a user equipment and a storage medium are provided. A memory in the user equipment is additionally utilized to store calibrated OTP data therein so that the calibrated OTP data stored in the memory can be written directly into a register of an optical sensor of the camera each time the user equipment accesses the camera to thereby avoid OTP data calibration each time the user equipment accesses the camera, and shorten a period of time for the user equipment to access the camera and a period of time for the camera to start while avoiding an overly amount of calibration calculations, lowering a load on a kernel of the user equipment and improving the experience of a user.

15 Claims, 3 Drawing Sheets

METHOD OF STARTING CAMERA IN USER EQUIPMENT, USER EQUIPMENT AND STORAGE MEDIUM

FIELD

The present disclosure relates to the field of electronics and particularly to a method of starting a camera in a user equipment, a user equipment and a storage medium.

BACKGROUND

There are increasingly high requirements on the performance and effects of cameras in mobile user equipments along with rapid development of the mobile user equipments. On one hand, their rapid starting, rapid taking of a picture, etc., are required in terms of operational performance; and on the other hand, increasing fineness, delicacies, etc., of their display effects are also required.

However there are numerous factors limiting the performance and effects of the cameras in mobile user equipments. Generally, camera modules are different in materials of their lens, structures of the lens, processes of assembling respective components in the modules, shading effects between the modules, etc. Calibration of the uniformity of the lens of the camera modules, the uniformity in color of the camera modules, etc., by the same set of parameters tends to come with an unsatisfactory effect.

SUMMARY

An embodiment of the invention provides a method of starting a camera in a user equipment, which includes:
receiving an instruction to start the camera; and
reading camera module One Time Programmable (OTP) data in a memory in response to the instruction and when valid camera module OTP data is read, writing the valid camera module OTP data into a register of an optical sensor of the camera.

An embodiment of the invention provides a user equipment including one or more processors and a storage medium storing computer readable program codes, the computer readable program codes stored in the storage medium performing upon being executed by the one or more processors the method of starting a camera.

An embodiment of the invention provides a storage medium storing computer readable program codes, the computer readable program codes performing upon being executed by one or more processor the method of starting a camera.

BRIEF DESCRIPTION OF THE DRAWINGS

In order to make the technical solutions of the embodiments of the invention more apparent, the drawings to be used in a description of the embodiments will be briefly introduced below, and apparently the drawings to be described below are merely illustrative of some embodiments of the invention, and those ordinarily skilled in the art can derive, from these drawings, other drawings without any inventive effort.

DETAILED DESCRIPTION

Figure 1:
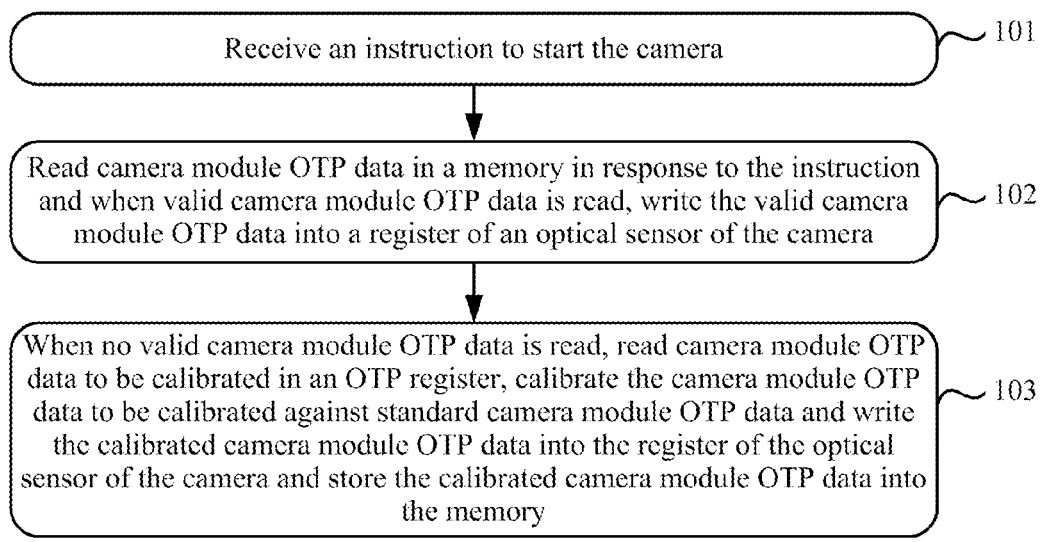
FIG. 1 is a method of starting a camera in a user equipment according to an embodiment of the invention.

In order to make the objects, the technical solutions and advantages of the disclosure more apparent, the disclosure will be further described in details with reference to the drawings. Apparently, the described embodiments are only a part but not all of the embodiments of the invention. Based upon the embodiments of the invention here, all of other embodiments derived by those ordinarily skilled in the art without any inventive effort shall come into the scope of the invention.

In an embodiment of the invention, each module is revised, while being produced, by recording camera module One Time Programmable (OTP) data for the module under a standard light source and burning corresponding parameters into an OTP register of the module. Calibrated OTP data is obtained by invoking values of respective configuration parameters in the camera module OTP data for calibration against values of respective configuration parameters in the standard camera module OTP data. The calibrated OTP data is then stored so that a mobile terminal device can read and use the stored calibrated OTP data while initiating a camera. In an embodiment of the invention, in order to avoid a user equipment from calibrating camera module OTP data each time the user equipment accesses the camera to thereby improve a speed at which the camera is started and shorten a period of time for calibration, a memory in the user equipment is additionally utilized in the embodiment of the invention to store calibrated OTP data therein so that the calibrated OTP data stored in the memory can be written directly into a register of an optical sensor of the camera each time the user equipment accesses the camera to thereby avoid calibration each time the user equipment accesses the camera, and shorten a period of time for the user equipment to access the camera and a period of time for the camera to start while avoiding an overly amount of calibration calculations, lowering a load on a kernel of the user equipment and improving the experience of a user.

The solution of the disclosure will be described below in details through embodiments thereof, but it shall be noted that the invention will not be limited to the following embodiments.

For the sake of a convenient description, a user equipment as referred to in the following embodiments can be embodied as a handset but will not be limited thereto and can also be a tablet computer, an electronic book reader, an MP3 player (MP3 stands for Moving Picture Experts Group Audio Layer III), an MP4 player (MP4 stands for Moving Picture Experts Group Audio Layer IV), a laptop portable computer, a desktop computer, etc.

If a camera in the handset is required to perform a normal camera function, then camera module OTP data needs to be calibrated. In one embodiment, the camera module OTP data has to be calibrated by the user equipment each time the camera is started.

The camera module OTP data refers to configuration parameters of the camera module, including:
1. A lens uniformity parameter of the camera module;
2. Automatic White Balance (AWB) parameters of the module, including color ratios of R/G, B/G, etc., of the module, which are used with standard ratios to calculate a gain value for setting an image to avoid a chromatic aberration from occurring;

3. An Auto Focus (AF) location of the module, which can improve rapidly the auto-focus speed and precision of the module; and 4. Other parameters, including the model of lens, the model of the camera module, a production date, etc.

All of the camera module OTP data above is burned in advance into an OTP register. In order to improve the yield of burning the camera module OTP data, generally three areas are reserved in the OTP register for burning. If there is an error while burning in the first area, then the second area is selected for burning, and if there is also an error while burning in the second area, then the third area can be selected for burning, thereby improving the yield of burning the camera module OTP data. However the OTP data is burned without recording the specific area into which the OTP data is burned, so the OTP data of the camera module may not necessarily be read by accessing directly the area in which the OTP data is stored but can be read only after two or three accesses. Apparently, the process of reading the camera module OTP data in the OTP register may also be complicated and prolong a period of time for the camera to start.

In view of this, on one hand, in order to avoid the user equipment from calibrating the camera module OTP data upon each access to the camera, the inventors of this application have identified that calibration of camera module OTP data for each handset can be scheduled to be performed in a manual check of the handset before shipment from a factory. The manual check of the handset refers to a technical check of respective functions of the handset or initialization setting of some functions. Particularly a manual check of the camera in the handset may include calibration of the camera module OTP data in addition to a quality check of the camera module.

On the other hand, in order to avoid the complicated process of reading the camera module OTP data in the OTP register, the inventors of this application have identified that the camera module OTP data to be calibrated can be calibrated against standard camera module OTP data in a manual check, and the calibrated camera module OTP data can be stored in the existing memory of the user equipment, before shipment from a factory, so that the calibrated camera module OTP data stored in the memory can be invoked directly to start the camera without reading and calibrating the camera module OTP data in the OTP register.

Since camera module OTP data of the same batch of modules produced by a manufacturer of the modules is typically distributed normally, an average of the camera module OTP data can be taken as standard camera module OTP data.

The memory is preferably a Nonvolatile Random Access Memory (NV RAM) which is a random memory capable of keeping stored data when power is removed from the system, where the NV RAM is typically consisted of a static RAM and a persistent battery and can be configured to record radio frequency related data received by the user equipment.

However, calibration prior to shipment from the factory may not be accurate, and the manual check may come with missing to check or a human check error resulting in the invalidity or absence of camera module OTP data stored in the memory after shipment from the factory. In such a situation, the camera module OTP data in the OTP register needs to be calibrated to start the camera when the user accesses the user equipment for the first time.

A method of starting a camera according to an embodiment of the invention is provided and applicable to, for example, a handset or another type of user equipment. As illustrated in FIG. 1 illustrating a flow chart of a method of starting a camera according to an embodiment of the invention, the method particularly includes the following operations.

An operation 101 is to receive an instruction to start the camera.

In an implementation, for a user equipment with a touch screen, when an icon of a camera application on an interface of the user equipment is selected by a touch operation, the camera application can be triggered to issue an instruction to start the camera. In another implementation scenario, when an application associated with a camera application is started, the application starts the camera application to thereby trigger the camera application to issue an instruction to start the camera. The camera can alternatively be trigger to start in other ways, and the invention will not be limited in this regard.

An operation 102 is to read camera module OTP data in a memory in response to the instruction and when valid camera module OTP data is read, to write the valid camera module OTP data into a register of an optical sensor of the camera.

In this operation 102, when receiving the instruction to start the camera, the camera module may read camera module OTP data in the memory in response to the instruction, and when valid camera module OTP data is read, that is, when the read camera module OTP data is camera module OTP data which has been calibrated and calibrated correctly, the camera module may write the valid camera module OTP data into a register of the optical sensor of the camera, so that the camera module OTP data written into the register of the optical sensor of the camera can be invoked and loaded by an internal processor according to the type of a camera application triggered from the outside.

Optionally the camera module OTP data read from the memory may be subjected to two judgments to judge whether the read camera module OTP data is calibrated valid data. A first judgment is performed to judge whether the camera module OTP data has been calibrated, and if so, then a further judgment is performed to judge whether the camera module OTP data has been calibrated correctly, and if so, then the camera module OTP data is write into the register of the optical sensor of the camera.

Particularly the first judgment is to judge whether the read camera module OTP data has been calibrated. Prior to this judgment, initial values can be set respectively for configuration parameters of the camera module, where the initial values are values (e.g., 0, −1, etc.) unavailable to all the configuration parameters of a normal camera module. When the camera module OTP data is read, the values of all the configuration parameters in the camera module OTP data are compared one by one with the corresponding preset initial values, and the camera module OTP data is determined to have been calibrated upon judging that none of the values of the respective configuration parameters in the read camera module OTP data is equal to its initial value; and The further judgment is to judge whether the camera module OTP data has been calibrated correctly. This judgment is further to the first judgment indicating that the camera module OTP data has been calibrated, but the calibrated camera module OTP data may not necessarily be valid, so it needs to be further judged whether the camera module OTP data has been calibrated correctly. Particularly a specific range of values [m, n] can be preset respectively for the configuration parameters, and if all the configuration parameters in the read camera module OTP data fall into their ranges of values [m, n], then the camera module OTP data is determined to have been calibrated correctly, or if at least one of the configuration parameters in the read camera module OTP data goes beyond its range of value [m, n], then the camera module OTP data is determined to be calibrated incorrectly.

If either the first judgment indicates that the camera module OTP data has not been calibrated or the further judgment indicates that it has been calibrated incorrectly, then it can be determined that no valid camera module OTP data has been read.

With the forgoing two judgments, the camera module OTP data stored in the memory can be checked accurately for validity and written in a timely manner into the register of the optical sensor of the camera after being determined to be valid.

An operation 103 is, when no valid camera module OTP data is read, to read camera module OTP data to be calibrated in an OTP register, to calibrate the camera module OTP data to be calibrated against standard camera module OTP data and to write the calibrated camera module OTP data into the register of the optical sensor of the camera and store the calibrated camera module OTP data into the memory.

If no valid camera module OTP data is read from the memory, then operations similar to a manual check of the handset may be performed in which the camera module OTP data to be calibrated, stored in the OTP register is read, and when valid camera module OTP data to be calibrated is read, the camera module OTP data to be calibrated is calibrated against with the standard camera module OTP data, and the calibrated camera module OTP data is written into the register of the optical sensor of the camera and stored into the memory.

Since camera module OTP data is burned into an OTP register typically by setting a flag bit for the camera module OTP data, and when the flag bit in the read camera module OTP data in the OTP register is 1, and none of the values of the configuration parameters in the camera module OTP data is 0, then the camera module OTP data is determined to be valid; otherwise, the camera module OTP data is invalid.

A flow of a process of starting a camera of a handset will be described below in details with reference to FIG. 2, but the invention will not be limited to the following application scenario.

Operation 201, the handset entering a camera mode.

Operation 202, reading camera module OTP data stored in an NV RAM.

Operation 203, judging whether values of respective configuration parameters in the read camera module OTP data are 0, and if so, determining that the camera module OTP data has not been calibrated and thus is invalid data, and then proceeding to an operation 207, otherwise, determining that the camera module OTP data has been calibrated but without any knowledge of validity of the camera module OTP data; and further judging whether the values of the respective configuration parameters fall into a reasonable range of calibration values, which can be set to [1, 5] for example, if the values of the respective configuration parameters in the read camera module OTP data fall into this range of calibration values, determining that the read camera module OTP data has been calibrated correctly and the camera module OTP data is valid and then proceeding to an operation 204, otherwise, proceeding to the operation 207. Reasonable ranges of calibration values can alternatively be set for respective configuration parameters.

Operation 204, writing the read camera module OTP data into a register of an optical sensor of the camera.

Operation 205, loading the camera module OTP data.

Operation 206, exiting the camera.

Operation 207, reading camera module OTP data to be calibrated, stored in an OTP register.

Operation 208, judging whether there is a flag bit of 1 in the read camera module OTP data to be calibrated and none of the values of the configuration parameters in the camera module OTP data is 0, and if so, determining that the camera module OTP data is valid and then proceeding to an operation 209; otherwise, proceeding to an operation 210.

Operation 209, calibrating the read camera module OTP data to be calibrated, against standard camera module OTP data, writing the calibrated camera module OTP data into the register of the optical sensor of the camera and storing the calibrated camera module OTP data into the NV RAM, and then proceeding to the operation 205.

Operation 5210, returning an error message and then proceeding to the operation 206.

Figure 3:
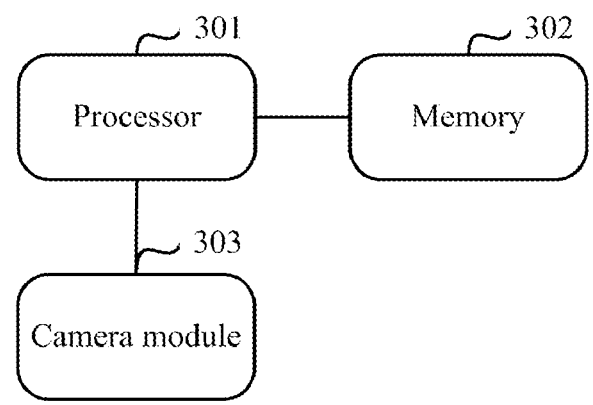
FIG. 3 is a structural diagram of general functional components in a user equipment according to an embodiment of the invention.
Figure 4:
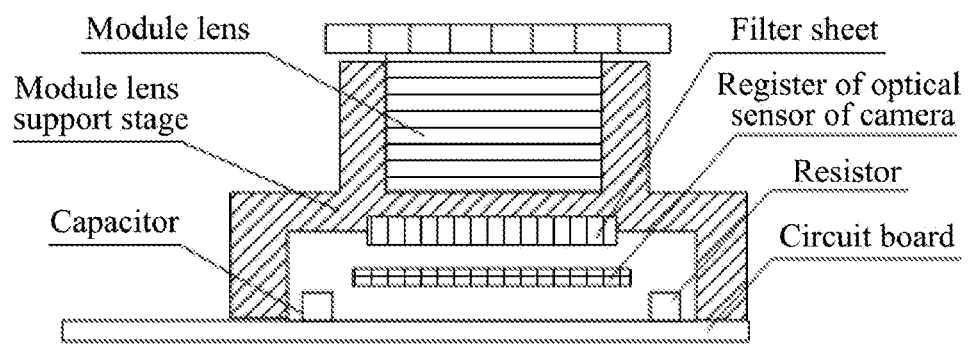
FIG. 4 is a structural diagram of a camera module according to an embodiment of the invention.

An embodiment of the invention further provides a user equipment, as illustrated in FIG. 3, which generally includes a processor 301, a memory 302 and a camera module 303. The camera module 303 is generally a unit performing a camera function, and FIG. 4 illustrates a structure of the camera module, where the structure can generally include component units which are module lens, a module lens support stage, capacitors/resistors, a filter sheet, a register of an optical sensor of the camera (which is also an OTP register, where the two registers including the register of the optical sensor of the camera and the OTP register may be a single register although they are denominated as different register names in view of different contents registered therein), a circuit board, etc. The respective component units in the camera module 303 operate in cooperation with the memory 301 and the memory 302 in the user equipment in the course of taking a picture.

Figure 2:
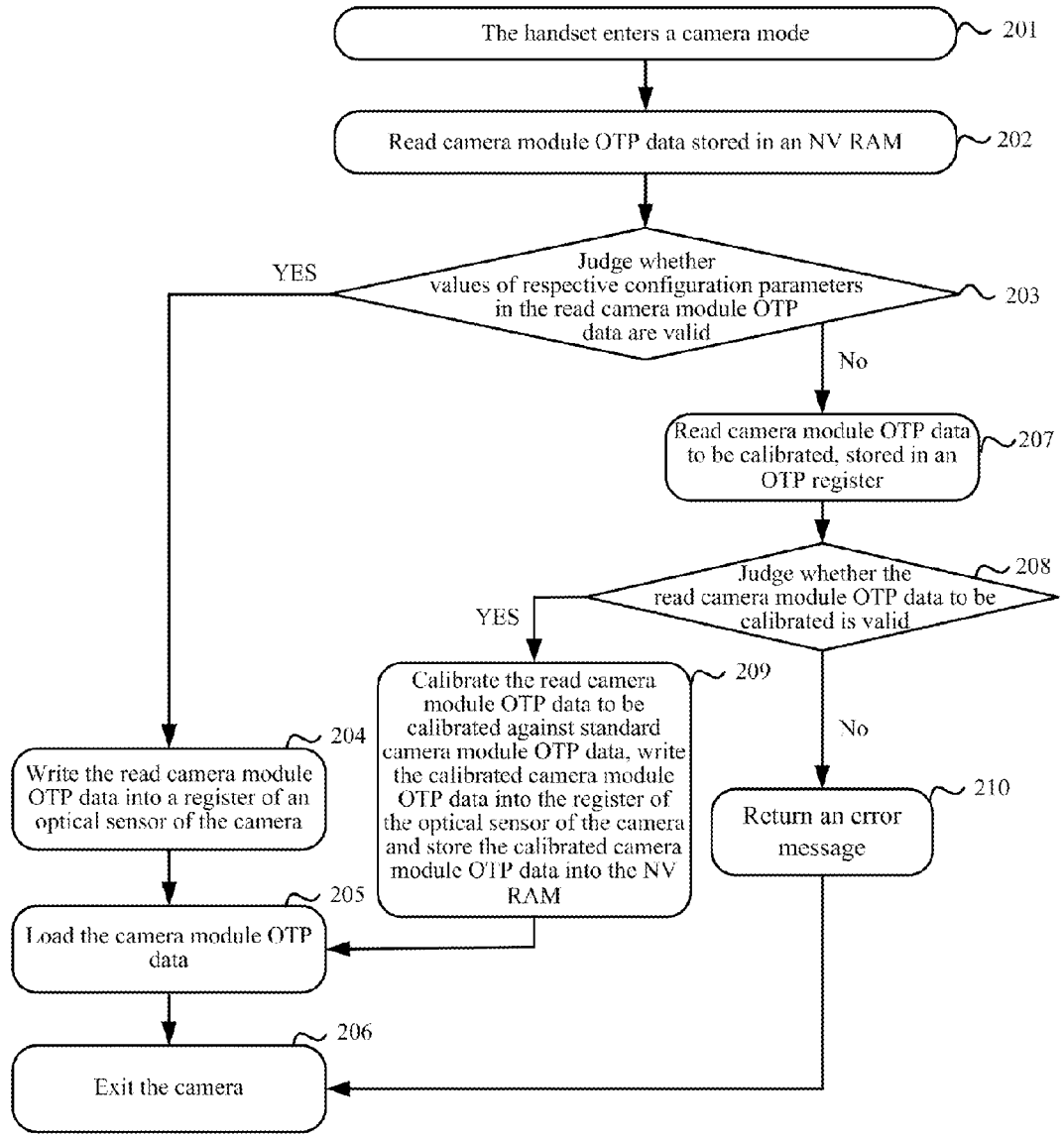
FIG. 2 is a flow chart of a process of starting a camera in a handset according to an embodiment of the invention.

Computer readable program codes are stored in the memory 302, and the computer readable program codes stored in the memory 302 are executed by the processor 301 to perform a method of starting a camera in a user equipment; and reference can be made for the relevant description of the embodiments illustrated in FIG. 1 and FIG. 2 for the operations of the method, and a repeated description thereof will be omitted here.

In another aspect, still another embodiment of the invention further provides a computer readable storage medium which can be a computer readable storage medium included in the memory in the foregoing embodiment or can be a computer readable storage medium separate instead of being installed into a user equipment. One or more programs are stored in the computer readable storage medium and executed by one or more processors to perform a method of starting a camera in a user equipment; and reference can be made for the relevant description of the embodiments illustrated in FIG. 1 and FIG. 2 for the operations of the method, and a repeated description thereof will be omitted here.

Those skilled in the art shall appreciate that the embodiments of the invention can be embodied as a method, a system or a computer program product. Therefore the invention can be embodied in the form of an all-hardware embodiment, an all-software embodiment or an embodiment of software and hardware in combination. Furthermore the invention can be embodied in the form of a computer program product embodied in one or more computer useable storage mediums (including but not limited to a disk memory, a CD-ROM, an optical memory, etc.) in which computer useable program codes are contained.

The invention has been described in a flow chart and/or a block diagram of the method, the device (system) and the computer program product according to the embodiments of the invention. It shall be appreciated that respective flows and/or blocks in the flow chart and/or the block diagram and combinations of the flows and/or the blocks in the flow chart and/or the block diagram can be embodied in computer program instructions. These computer program instructions can be loaded onto a general-purpose computer, a specific-purpose computer, an embedded processor or a processor of another programmable data processing device to produce a machine so that the instructions executed on the computer or the processor of the other programmable data processing device create means for performing the functions specified in the flow(s) of the flow chart and/or the block(s) of the block diagram.

These computer program instructions can also be stored into a computer readable memory capable of directing the computer or the other programmable data processing device to operate in a specific manner so that the instructions stored in the computer readable memory create an article of manufacture including instruction means which perform the functions specified in the flow(s) of the flow chart and/or the block(s) of the block diagram.

These computer program instructions can also be loaded onto the computer or the other programmable data processing device so that a series of operational steps are performed on the computer or the other programmable data processing device to create a computer implemented process so that the instructions executed on the computer or the other programmable device provide steps for performing the functions specified in the flow(s) of the flow chart and/or the block(s) of the block diagram.

Although the preferred embodiments of the invention have been described, those skilled in the art benefiting from the underlying inventive concept can make additional modifications and variations to these embodiments. Therefore the appended claims are intended to be construed as encompassing the preferred embodiments and all the modifications and variations coming into the scope of the invention.

Evidently those skilled in the art can make various modifications and variations to the invention without departing from the essence and scope of the invention. Thus the invention is also intended to encompass these modifications and variations thereto so long as the modifications and variations come into the scope of the claims appended to the invention and their equivalents.

The invention claimed is:

1. A method of starting a camera in a user equipment comprising:
   receiving an instruction to start the camera; and
   reading camera module One Time Programmable (OTP) data in a memory in response to the instruction and when valid camera module OTP data is read, writing the valid camera module OTP data into a register of an optical sensor of the camera
   wherein the reading camera module OTP data in the memory and when valid camera module OTP data is read, writing the valid camera module OTP data into the register of the optical sensor of the camera comprises:
      reading the camera module OTP data in the memory, and judging whether the camera module OTP data has been calibrated, and when it is judged that the camera module OTP data has been calibrated, further judging whether the camera module OTP data has been calibrated correctly, and when it is judged that the camera module OTP data has been calibrated correctly, writing the camera module OTP data into the register of the optical sensor of the camera.

2. The method of claim 1, further comprising:
   when no valid camera module OTP data is read, reading camera module OTP data to be calibrated in an OTP register, and when valid camera module OTP data to be calibrated is read, calibrating the camera module OTP data to be calibrated against with standard camera module OTP data, and writing the calibrated camera module OTP data into the register of the optical sensor of the camera and storing the calibrated camera module OTP data into the memory.

3. The method of claim 1, wherein the judging whether the camera module OTP data has been calibrated, and when it is judged that the camera module OTP data has been calibrated, further judging whether the camera module OTP data has been calibrated correctly comprises:
   judging whether the camera module OTP data is a preset initial value, and when it is judged that the camera module OTP data is the preset initial value, determining that the camera module OTP data has not been calibrated; or when it is judged that the camera module OTP data is not the preset initial value, determining that the camera module OTP data has been calibrated, and further judging whether the camera module OTP data is located in a preconfigured valid area, and when it is judged that the camera module OTP data is located in the preconfigured valid area, determining that the camera module OTP data has been calibrated correctly; or when it is judged that the camera module OTP data is not located in the preconfigured valid area, determining that the camera module OTP data has not been calibrated correctly.

4. The method of claim 1, wherein the camera module OTP data comprises a lens uniformity parameter of a module, an auto white balance parameter of the module and an auto focus location of the module.

5. The method of claim 1, wherein the memory is a non-volatile random access memory.

6. A user equipment comprising one or more processors and a storage medium storing computer readable program codes, wherein the one or more processors are configured to execute the computer readable program codes to perform:
   receiving an instruction to start the camera; and
   reading camera module One Time Programmable (OTP) data in a memory in response to the instruction and when valid camera module OTP data is read, writing the valid camera module OTP data into a register of an optical sensor of the camera
   wherein the reading camera module OTP data in the memory and when valid camera module OTP data is read, writing the valid camera module OTP data into the register of the optical sensor of the camera comprises:
      reading the camera module OTP data in the memory, and judging whether the camera module OTP data has been calibrated, and when it is judged that the camera module OTP data has been calibrated, further judging whether the camera module OTP data has been calibrated correctly, and when it is judged that the camera module OTP data has been calibrated correctly, writing the camera module OTP data into the register of the optical sensor of the camera.

7. The user equipment of claim 6, wherein the one or more processors are configured to execute the computer readable program codes to further perform: when no valid camera module OTP data is read, reading camera module OTP data to be calibrated in an OTP register, and when valid camera module OTP data to be calibrated is read, calibrating the camera module OTP data to be calibrated against with standard camera module OTP data, and writing the calibrated camera module OTP data into the register of the optical sensor of the camera and storing the calibrated camera module OTP data into the memory.

8. The user equipment of claim 6, wherein the judging whether the camera module OTP data has been calibrated, and when it is judged that the camera module OTP data has been calibrated, further judging whether the camera module OTP data has been calibrated correctly comprises:

judging whether the camera module OTP data is a preset initial value, and when it is judged that the camera module OTP data is the preset initial value, determining that the camera module OTP data has not been calibrated; or when it is judged that the camera module OTP data is not the preset initial value, determining that the camera module OTP data has been calibrated, and further judging whether the camera module OTP data is located in a preconfigured valid area, and when it is judged that the camera module OTP data is located in the preconfigured valid area, determining that the camera module OTP data has been calibrated correctly; or when it is judged that the camera module OTP data is not located in the preconfigured valid area, determining that the camera module OTP data has not been calibrated correctly.

9. The user equipment of claim 6, wherein the camera module OTP data comprises a lens uniformity parameter of a module, an auto white balance parameter of the module and an auto focus location of the module.

10. The user equipment of claim 6, wherein the memory is a nonvolatile random access memory.

11. A non-transitory computer storage medium, storing computer readable program codes, the computer readable program codes being executed by one or more processors to perform:
  receiving an instruction to start the camera; and
  reading camera module One Time Programmable (OTP) data in a memory in response to the instruction and when valid camera module OTP data is read, writing the valid camera module OTP data into a register of an optical sensor of the camera
  wherein the reading camera module OTP data in the memory and when valid camera module OTP data is read, writing the valid camera module OTP data into the register of the optical sensor of the camera comprises:
    reading the camera module OTP data in the memory, and judging whether the camera module OTP data has been calibrated, and when it is judged that the camera module OTP data has been calibrated, further judging whether the camera module OTP data has been calibrated correctly, and when it is judged that the camera module OTP data has been calibrated correctly, writing the camera module OTP data into the register of the optical sensor of the camera.

12. The non-transitory computer storage medium of claim 11, wherein the computer readable program codes are executed by one or more processors to further perform: when no valid camera module OTP data is read, reading camera module OTP data to be calibrated in an OTP register, and when valid camera module OTP data to be calibrated is read, calibrating the camera module OTP data to be calibrated against with standard camera module OTP data, and writing the calibrated camera module OTP data into the register of the optical sensor of the camera and storing the calibrated camera module OTP data into the memory.

13. The non-transitory computer storage medium of claim 11, wherein the judging whether the camera module OTP data has been calibrated, and when it is judged that the camera module OTP data has been calibrated, further judging whether the camera module OTP data has been calibrated correctly comprises:

judging whether the camera module OTP data is a preset initial value, and when it is judged that the camera module OTP data is the preset initial value, determining that the camera module OTP data has not been calibrated; or when it is judged that the camera module OTP data is not the preset initial value, determining that the camera module OTP data has been calibrated, and further judging whether the camera module OTP data is located in a preconfigured valid area, and when it is judged that the camera module OTP data is located in the preconfigured valid area, determining that the camera module OTP data has been calibrated correctly; or when it is judged that the camera module OTP data is not located in the preconfigured valid area, determining that the camera module OTP data has not been calibrated correctly.

14. The non-transitory computer storage medium of claim 11, wherein the camera module OTP data comprises a lens uniformity parameter of a module, an auto white balance parameter of the module and an auto focus location of the module.

15. The non-transitory computer storage medium of claim 11, wherein the memory is a nonvolatile random access memory.

* * * * *